(12) United States Patent
Sprague et al.

(10) Patent No.: US 6,542,006 B1
(45) Date of Patent: Apr. 1, 2003

(54) RESET FIRST LATCHING MECHANISM FOR PULSED CIRCUIT TOPOLOGIES

(75) Inventors: Milo D. Sprague, Hudson, MA (US); Robert J. Murray, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/608,638

(22) Filed: Jun. 30, 2000

(51) Int. Cl.[7] .............................................. H03K 19/096
(52) U.S. Cl. .............................. 326/95; 326/98; 326/93; 327/208; 327/291; 327/294; 327/299
(58) Field of Search ............................... 326/93, 95, 98; 327/291, 294, 299, 200, 217, 208–212

(56) References Cited

U.S. PATENT DOCUMENTS

| | | | |
|---|---|---|---|
| 5,226,011 A | | 7/1993 | Yanagisawa |
| 5,453,708 A | | 9/1995 | Gupta et al. |
| 5,467,037 A | * | 11/1995 | Kumar et al. ............... 327/142 |
| 5,491,442 A | | 2/1996 | Mirov et al. |
| 5,517,136 A | | 5/1996 | Harris et al. |
| 5,535,343 A | | 7/1996 | Verseput |
| 5,708,374 A | | 1/1998 | Durham et al. |
| 5,721,875 A | | 2/1998 | Fletcher |
| 5,764,084 A | | 6/1998 | Lev |
| 5,796,282 A | | 8/1998 | Sprague et al. |
| 5,828,234 A | * | 10/1998 | Sprague ...................... 326/98 |
| 5,831,932 A | | 11/1998 | Merritt et al. |
| 5,880,608 A | | 3/1999 | Mehta et al. |
| 5,892,372 A | | 4/1999 | Ciraula et al. |
| 5,942,917 A | | 8/1999 | Chappell et al. |
| 5,952,859 A | * | 9/1999 | Kim et al. .................. 327/200 |
| 5,973,514 A | | 10/1999 | Kuo et al. |
| 5,986,475 A | * | 11/1999 | Kim et al. ................... 326/95 |
| 6,011,410 A | | 1/2000 | Kim et al. |
| 6,023,182 A | | 2/2000 | Milshtein et al. |
| 6,040,716 A | * | 3/2000 | Bosshart ...................... 326/98 |
| 6,094,071 A | * | 7/2000 | Ciraula et al. ................ 326/97 |
| 6,172,530 B1 | | 1/2001 | Bull et al. |
| 6,201,415 B1 | | 3/2001 | Manglore |
| 6,201,431 B1 | | 3/2001 | Allen et al. |
| 6,204,714 B1 | | 3/2001 | Milshtein et al. |
| 6,239,621 B1 | | 5/2001 | Milshtein et al. |
| 6,242,958 B1 | | 6/2001 | Fletcher |
| 6,275,069 B1 | | 8/2001 | Chung et al. |
| 6,320,441 B1 | | 11/2001 | Fletcher et al. |
| 6,331,793 B1 | | 12/2001 | Fletcher et al. |

FOREIGN PATENT DOCUMENTS

WO    WO 98/29949    7/1998

OTHER PUBLICATIONS

Alisa Scherer et al., An Out–of Order Three–Way Superscalar Multimedia Floating–Point Unit.
1999, pp. 94–95,449, Advanced Micro Devices, Sunnyvale, CA.

* cited by examiner

Primary Examiner—Michael Tokar
Assistant Examiner—Vibol Tan
(74) Attorney, Agent, or Firm—Cynthia T. Faatz

(57) ABSTRACT

A reset first latching mechanism comprises a pulse chopper circuit responsive to a pulsed signal to control initiation and termination of a reset pulse wherein a domino node is to be precharged in response to the reset pulse. The reset first latching mechanism also includes domino logic circuit responsive to an evaluate pulse at an input to evaluate at the domino node based on a logic function performed by the domino logic circuit. The reset pulse is timed such that the reset pulse is completed before the evaluate at the domino node occurs.

22 Claims, 7 Drawing Sheets

RESET FIRST LATCHING MECHANISM FOR PULSED CIRCUIT TOPOLOGIES

CROSS-REFERENCE TO RELATED APPLICATIONS

This application is related to copending U.S. patent applications Ser. No. 09/607,897, entitled, "Pulsed Circuit Topology to Perform a Memory Array Write Operation," Ser. No. 09/608,389, entitled, "A Global Clock Self-Timed Circuit with Self-Terminating Precharge for High Frequency Applications," and Ser. No. 09/608,857, entitled, "Pulsed Circuit Topology Including a Pulsed, Domino Flip-Flop," each of which is concurrently filed herewith.

BACKGROUND

1. Field

An embodiment of the present invention relates to the field of high frequency integrated circuits and, more particularly, to a latching mechanism that may be used in high frequency integrated circuits.

2. Discussion of Related Art

Advances in semiconductor manufacturing technologies have enabled circuit designers to continue to integrate more transistors on a single die. At the same time, computer architecture, and more specifically, processor architecture, continues to focus on shorter and shorter cycle times.

Domino logic is frequently used in an effort to reduce power, die area and output capacitance as compared to static full complementary metal oxide semiconductor (CMOS) logic. The reduction in parasitic capacitance provided by domino CMOS logic permits higher speed and lower power operation.

As clock speeds continue to increase (and thus, cycle times continue to decrease) and/or where certain parts of a chip operate at a much higher frequency, limitations of conventional logic circuits, including conventional domino logic circuits, may prevent such circuits from operating properly at the higher clock speeds. Further, many conventional domino logic circuits operate using a two-phase clock. For very high operating frequencies, it may not be feasible to generate and distribute a two-phase clock due to noise, clock jitter and/or other issues.

Where a pulsed clock is used instead of a conventional two-phase clock, the logic may be more susceptible to functional errors due to race conditions making such circuits more difficult for design engineers to work with. Further, pulsed signals can only be communicated relatively short distances as compared to their static counterparts.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A reset first latching mechanism and method for use in pulsed clock circuitry is described. In the following description, particular types of integrated circuits and integrated circuit configurations are described for purposes of illustration. It will be appreciated, however, that other embodiments are applicable to other types of integrated circuits and to integrated circuits configured in another manner.

For one embodiment, the reset first latching mechanism includes a pulse chopper circuit responsive to a pulsed signal to control initiation and termination of a reset pulse at a domino node. The reset first latching mechanism further includes a domino logic circuit coupled to the domino node and responsive to an evaluate pulse at an input to evaluate at the domino node based on a logic function performed by the domino logic circuit. The evaluate pulse is timed such that the evaluation at the domino node occurs shortly after completion of the reset pulse.

The reset first latching mechanism of some embodiments may be used, for example, as a final domino stage in a pulsed domino circuit topology or pulsed domino pipestage to provide an interface between pulsed and static circuitry. In this manner, it may be possible to drive a data signal over a longer distance than would be possible with a corresponding pulsed signal. Further, the reset first latching mechanism of some embodiments improves some race conditions and reduces the number of race conditions as compared to other latching approaches that may be used in a pulsed environment such that it may be easier for designers to work with.

Figure 1:
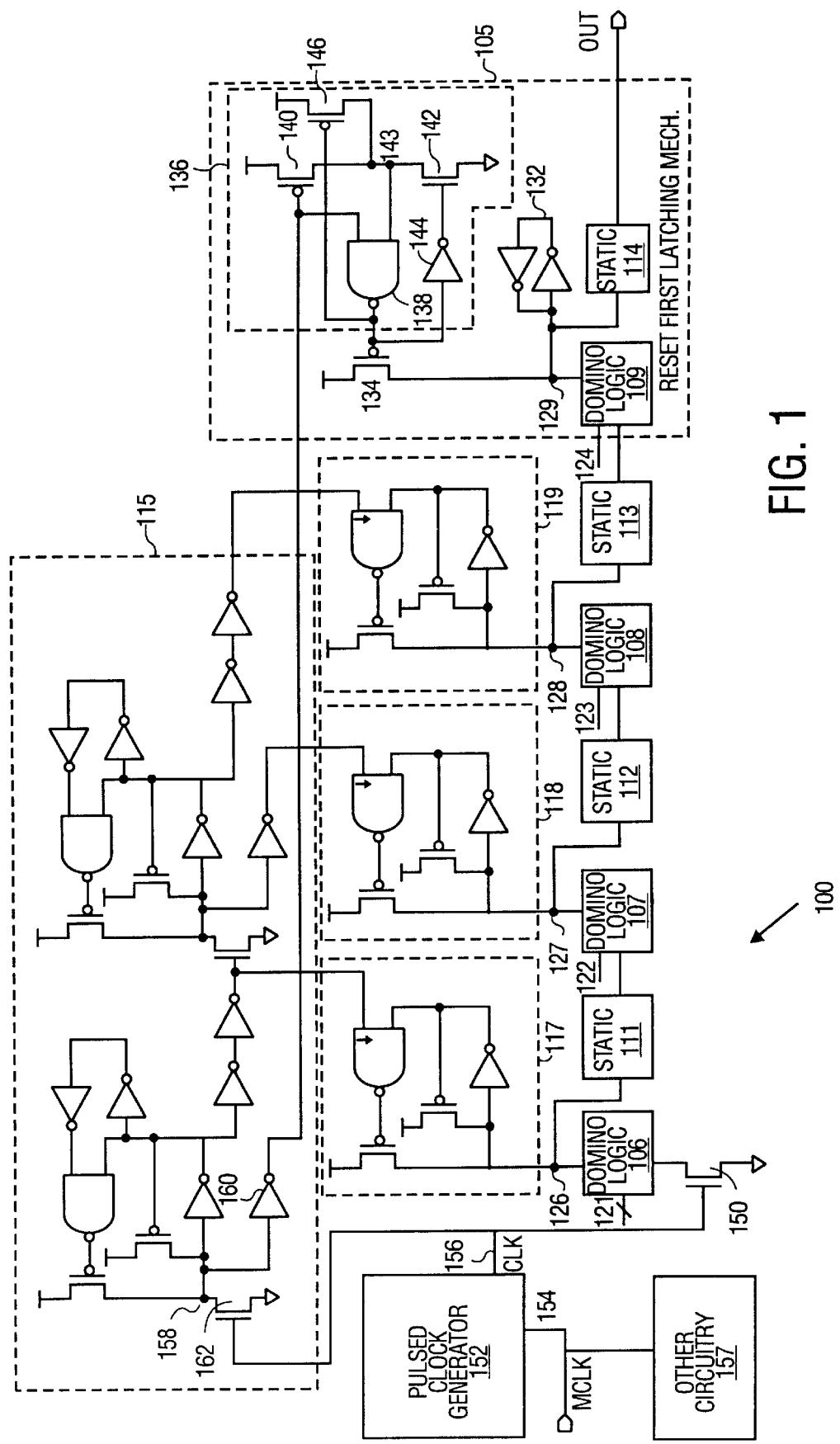
FIG. 1 is a schematic diagram of a pulsed circuit topology including the reset first latching mechanism of FIG. 4.
Figure 4:
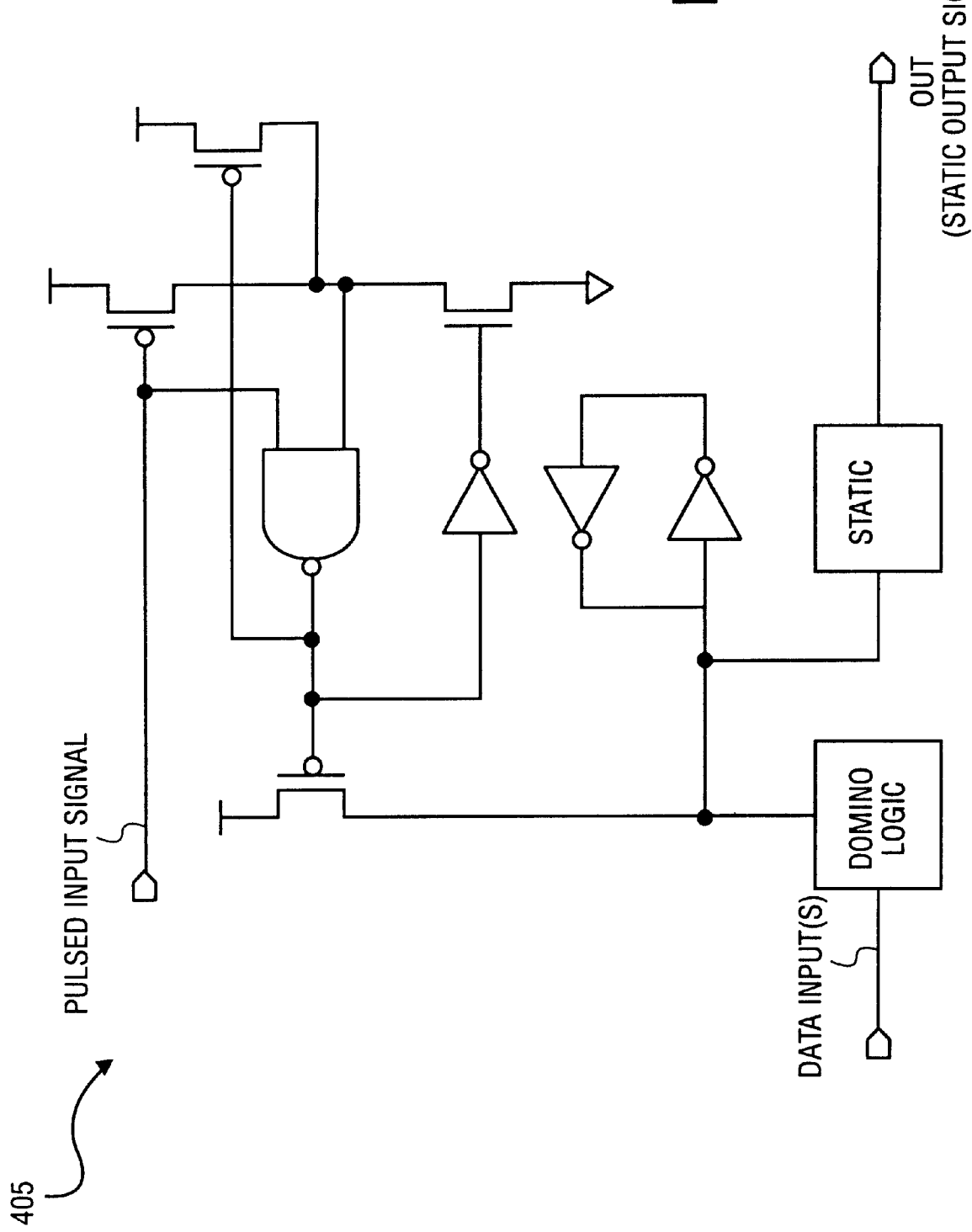
FIG. 4 is a schematic diagram of a reset first latching mechanism of one embodiment.

FIG. 4 is a schematic diagram illustrating a reset first latching mechanism 405 of one embodiment. For purposes of illustration, the configuration and operation of the reset first latching mechanism 405 is described in the context of an exemplary pulsed circuit 100 in reference to FIG. 1. In FIG. 1, a reset first latching mechanism 105 in the exemplary circuit is similar in configuration and operation to the reset first latching mechanism 405. It will be appreciated that, while the reset first latching mechanism 105 is shown for exemplary purposes as being a part of the circuit 100, the reset first latching mechanism 105 may also be used in other types of circuits configured in a different manner.

Referring to FIG. 1, the circuit 100 (which may not necessarily include a pulsed clock generator) may be referred to as a domino pipestage. In the domino pipestage of FIG. 1, the reset first latching mechanism 105 may provide an advantageous interface circuit to subsequent circuitry (not shown) as described in more detail below.

In addition to the reset first latching mechanism 105, the circuit 100 includes domino logic stages 106–109, static logic stages 111–114, global clock self-timed reset circuitry 115 (also referred to herein as global reset circuitry), and self-terminating precharge circuits or stages 117–119. It will be appreciated that, depending on the circuitry in which the reset first latching mechanism of various embodiments is implemented, a different number of logic stages and/or reset circuitry configured in a different manner may precede the reset first latching mechanism.

Figure 5:
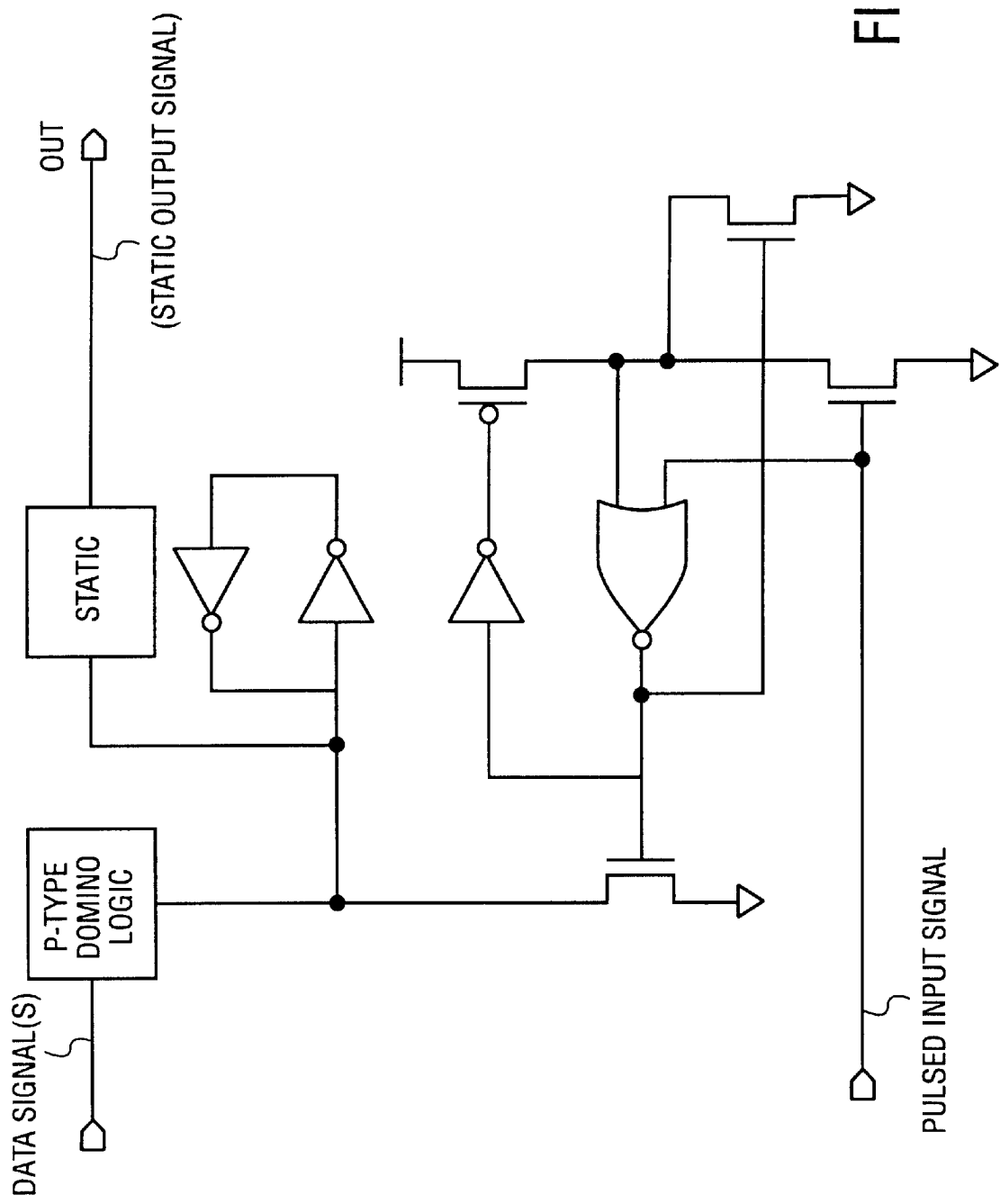
FIG. 5 is a schematic diagram of a reset first latching mechanism of another embodiment using complementary logic.

For the exemplary circuit 100 of FIG. 1, the domino logic 106–109 includes n-type domino logic stacks. For other embodiments, p-type domino logic or a combination of both p- and n-type domino logic may be used. Where p-type domino logic is used, other circuitry coupled to the p-type domino logic is complementary to that shown and a complementary pulsed clock signal may be used. (An example of a reset first latching mechanism 501 using complementary logic (including p-type domino logic) is shown in FIG. 5.) Each of the domino logic stacks may perform any type of logical function (e.g. NAND, NOR, a complex logic function, etc.). Further, one or more of the domino logic stacks 116–119 may receive input data and/or control signal(s) from preceding logic (not shown) via one or more inputs 121–124.

The static logic blocks 111–114 may be inverters or inverting complex gates, for example. For one embodiment, one or more of the static logic blocks 111–114 may be implemented using ratioed logic. An example of ratioed logic is set forth in U.S. Pat. No. 5,942,917 entitled "High Speed Ratioed CMOS Logic Structures for a Pulsed Input Environment", issued Aug. 24, 1999 and assigned to the assignee of the present invention. Each of the static logic blocks 111–114 may also receive one or more input signal(s) from preceding logic (not shown).

The global clock self-timed circuitry 115 operatores in response to a pulsed clock signal Ck to globally intitate a rest (precharge) pulse at domino nodes 126–129 coupled to the global clock self-timed circuitry 115. Self-terminating precharge circuits 117–119 operate to locally terminate the respective reset pulses in response to the voltage level (or data) at the respective domino node. For the embodiment of FIG. 1, for example, once a domino node such as the domino node 126 has been adequately precharged in response to a globally initiated precharge pulse, three inversions later,the reset pulse is terminated by the self-terminating precharge circuit 117 in response to the logic high level at the precharged domino node. Details of global clock self-timed circuitry and self-terminating precharge circuitry similar to the global clock self-timed circuitry 115 and the self-terminating precharge circuits 117–119, as well as reset circuitry that may be used for other embodiments, are provided in a copending U.S. Pat. application Ser. No. 09/608,389 entitled "A Global Clock Self-Timed Circuit with Self-Terminating Precharge for High Frequency Applications," assigned to the assignee of the present invention. It will be appreciated that, for other embodiments, other types of circuitry, including other types of reset control circuitry may be coupled to the reset first latching mechanism.

Figure 6:
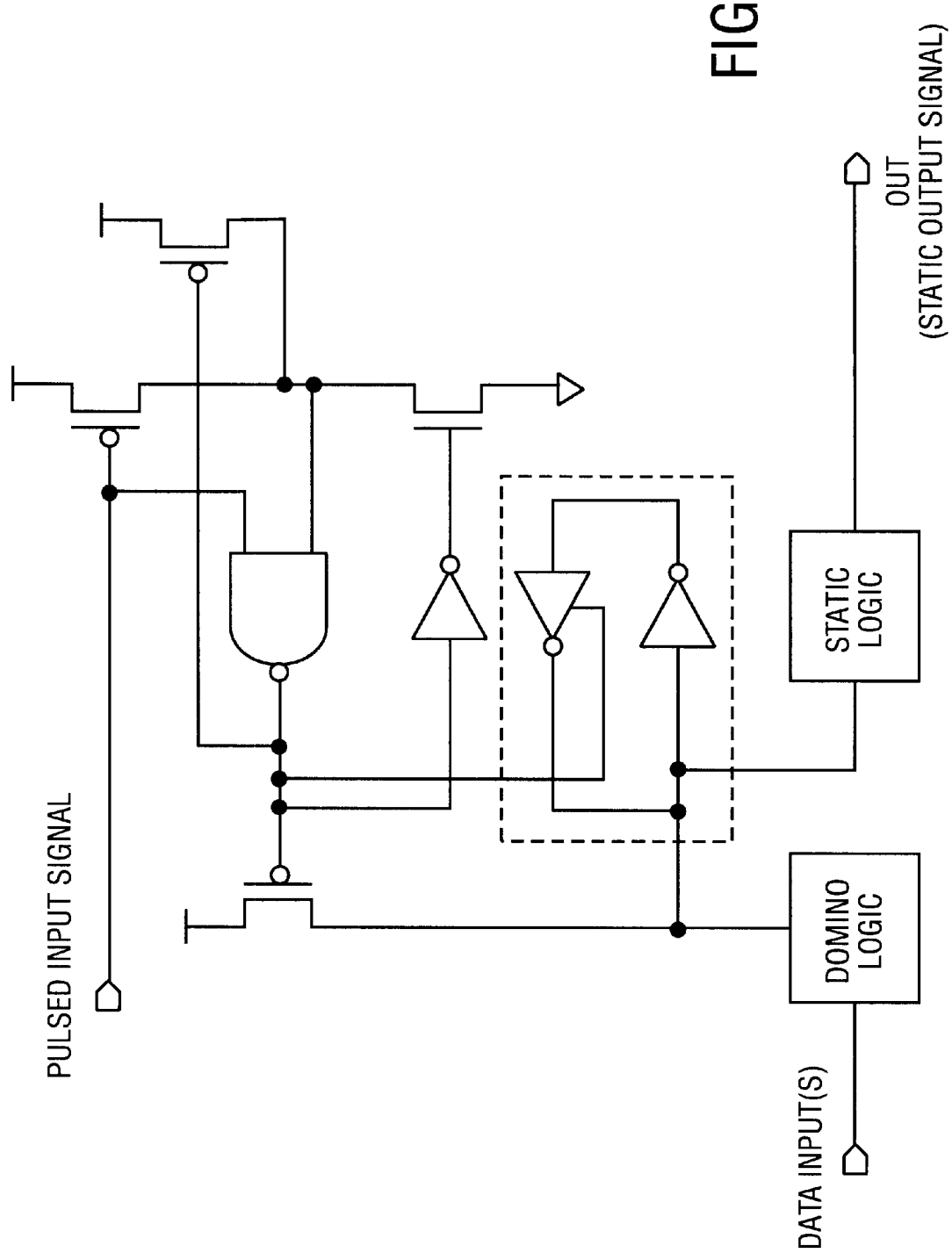
FIG. 6 is a schematic diagram of a reset first latching mechanism of another embodiment including an interrupted keeper.

The reset first latching mechanism 105 of one embodiment includes the domino logic stack 109 and static logic stage 114. It will be appreciated that, for other embodiments, a different number of static logic stages may be included in and/or coupled to the reset first latching mechanism 105. A latching element 132 is also included such that the reset first latching mechanism 105 may be used both as a latching mechanism as well as a logic gate. For the embodiment shown in FIG. 1, the latching element 132 is a jam latch. For other embodiments, however, a different type of latching element, such as an n-interrupted keeper 610, for example, may be used as shown in FIG. 6. A precharge (or reset) device 134 is coupled to the domino node 129 to control precharging of the domino node 129 and is responsive to a reset input signal provided by a pulse chopper circuit 136 (alternately referred to herein as a pulse reducer or pulse chopper and rearm circuit).

The pulse chopper circuit 136 of one embodiment includes a NAND gate 138 having an output coupled to the gate of the reset device 134. One input of the NAND gate 138 is coupled to the global reset circuitry 115 and to the gate of a second precharge device 140 and another input is coupled between the precharge device 140 and a pull-down device 142 at a node 143. As described in more detail below, the node 143 is a domino node. An inverter 144 has an input coupled to the output of the NAND gate 138 and an output coupled to the gate of the pull-down device 142. A small keeper device 146 has one terminal coupled to a power supply, another terminal coupled to the node 143 and a gate coupled to the output of the NAND gate 138.

As shown in FIG. 1, both the global reset circuitry 115 and an evaluate device 150 (that may be coupled to or may be a part of the domino logic 106) receive a signal Ck. For one embodiment the signal Ck is a pulsed clock signal provided by a pulsed clock generator 152. The pulsed clock generator 152 may be any type of pulsed clock generator. For one embodiment, the pulsed clock generator 152 receives a conventional single wire, two-phase input clock signal MCk at an input 154 and provides a double-frequency (i.e. two pulses for each MCk cycle), pulsed, single-phase clock signal Ck at an output 156. Where the circuit 100 is included in a microprocessor, the input clock signal MCk may be, for example, the processor clock used to clock other circuitry 157 on the same chip. It will be appreciated that the input clock signal MCk may be a different type of clock signal and/or may be provided from a different source. It will also be appreciated that the pulsed clock signal Ck may be any type of pulsed clock signal at any one of a range of frequencies from any pulsed clock source and may have any one of a variety of frequency relationships with respect to the MCk signal. Further, a pulsed clock input signal to the reset first latching mechanism of some embodiments may be provided from a separate pulsed clock source.

Examples of circuits that may be used to implement the pulsed clock generator 152 of one embodiment are described in U.S. Pat. No. 6,023,182 to Milshtein et al. entitled, "High Gain Pulse Generator," issued Feb. 8, 2000 and in U.S. Pat. No. 6,204,714 to Milshtein et al. entitled "Variable Width Pulse Generator," issued on Mar. 20, 2001, both of which are assigned to the assignee of the present invention. Other types of clock generator circuits that provide a pulsed clock signal meeting the below-described characteristics are within the scope of various embodiments.

Figure 2:
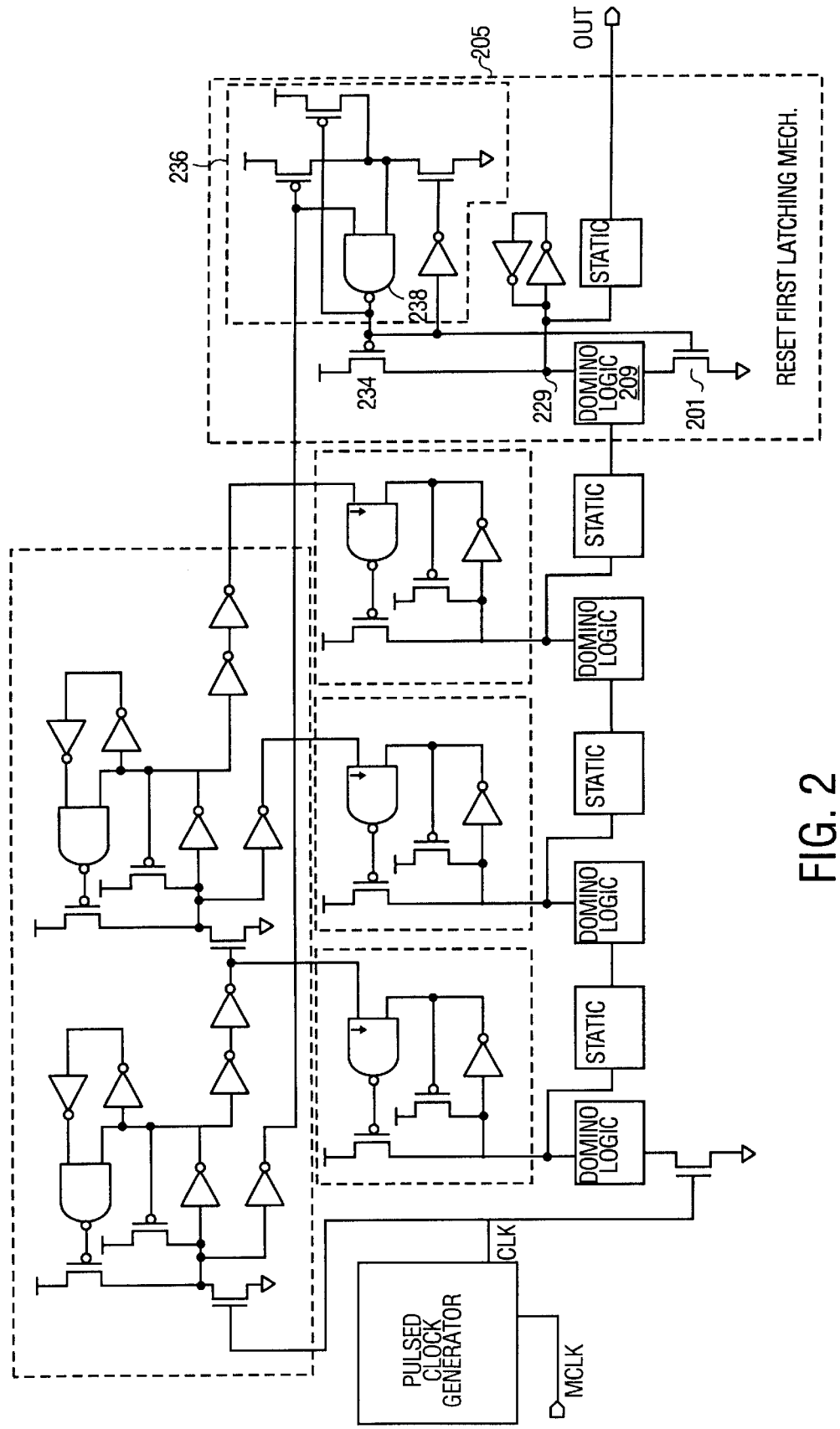
FIG. 2 is a schematic diagram of a pulsed circuit topology including a reset first latching mechanism of an alternative embodiment.
Figure 3:
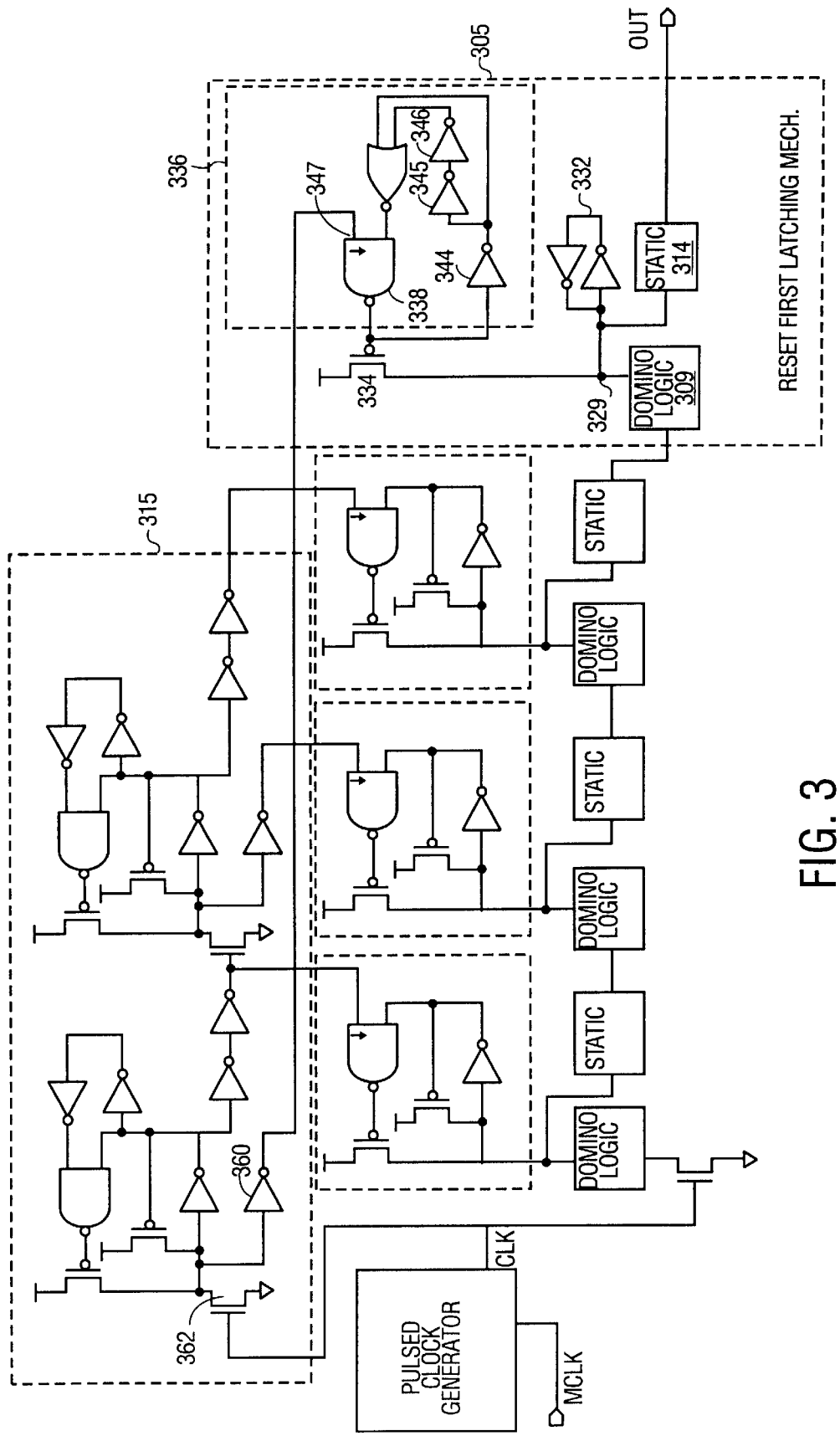
FIG. 3 is a schematic diagram of a pulsed circuit topology including a reset first latching mechanism of another alternative embodiment.

For the exemplary embodiments of FIGS. 1–3, the pulsed clock signal Ck has a pulse width approximately equal to five inversions (also referred to as unit delays) measured from a rising edge to a falling edge of the Ck signal. Also, for this exemplary embodiment, the Ck signal cycle time is equal to approximately eight inversions. It will be appreciated, however, that for other embodiments, the pulsed clock signal may have a different pulse width and/or a different cycle time.

In operation, when the pulsed clock signal Ck is low, assuming a node 158 in the global reset circuit 115 has previously been precharged, an output of an inverter 160 in the global reset circuit 115 is low. The input of the NAND gate 138 in the pulse reducer circuit 136 is, therefore, also low such that the output of the NAND gate 138 is high and the precharge device 134 is not enabled. The low output of the inverter 160 also enables the precharge device 140 such that the node 143 is precharged high. The other input to the NAND gate 138 coupled to the node 143 is therefore at a logic high level. In this manner, the pulse chopper circuit 136 is armed for the next pulsed clock signal Ck cycle.

A rising edge of the pulsed clock signal Ck received at a pull-down device 162 in the global reset circuit 115 causes the node 158 to be pulled down and an output of the inverter 160 to transition to a logic high level. This transition causes the input of the NAND gate 138 that was previously at a logic low level to transition to a logic high level. In response, the output of the NAND gate 138 transitions to a logic low level initiating a reset input pulse and enabling the reset device 134. In this manner, for the circuit 100 of FIG. 1, a reset pulse is received at the gate of the reset device 134 approximately three inversions after a rising edge of the pulsed clock signal Ck is received at the pull-down device 162. In response, the reset device 134 is turned on to precharge the domino node 129.

The latching element 132 latches or recycles the logical value indicated at the domino node 129 for use by subsequent static circuitry, thereby converting a pulsed input signal to the reset first latching mechanism 105 to a corresponding static output signal that may be used by subsequent logic. As the node 129 is precharged, for example, the latching element 132 sustains the logic high value at the node 129 until the node 129 evaluates low (at which point the latching element sustains the low value) or until the next clock cycle.

The low output level of the NAND gate 138 causes the small keeper device 146 to be enabled. The small keeper device 146 is provided to sustain the high level of the node 143 and thus, the high level of the NAND input to which it is coupled. Because the precharge device 140 is no longer enabled, this prevents the NAND gate 138 input from transitioning to a low level too early. Such an early transition of the NAND gate input could result in early termination of the reset pulse.

The logic low level of the NAND gate 138 also causes the output of the inverter 144 to transition to a logic high level to enable the pull-down device 142. Enabling the pull-down device 142 causes the input to the NAND gate 138 that is coupled to the node 143 to be pulled low. This is because the weak keeper device 146 is sized relative to the pull-down device 142 such that the pull-down device 142 prevails when both devices are enabled concurrently. Pulling the one input to the NAND gate 138 low causes the output of the NAND gate 138 to transition to a logic high level to disable the precharge device 134. In this manner, in response to a five inversion-wide pulsed clock signal Ck, the pulse chopper circuit 136 acts to chop the reset pulse at the input to the reset device 134 to have a pulse width equal to approximately three inversions. Thus, the reset pulse at the gate of the reset device 134 ends approximately six inversions after the rising edge of the pulsed Ck signal is received at the gate of the pull-down device 162.

The rising output of the NAND gate 138 causes the output of the inverter 144 to fall. Once the gate of the pull-down device 142 is low, the clock input to the reset first latching mechanism 105 (from the output of the inverter 160 in this example) can go low (i.e. the input clock pulse can end). This transition of the input clock pulse to a logic low level enables the device 140 to precharge the node 143 such that the pulse chopper circuit is rearmed for the next input clock cycle.

An evaluate pulse is received at the input to the domino stack 109 via the chain of domino and static logic stages of the exemplary embodiment of FIG. 1 in the following manner. A rising edge of the pulsed clock signal Ck is received at the gate of the evaluate device 150 concurrently with its arrival at the gate of the pull-down device 162.

Assuming inputs of the logic stages 106–109 and 111–114 are set such that the domino logic 109 evaluates low, an evaluate pulse is initiated at the input to the domino stack 109 six inversions after the rising edge of the Ck clock signal is received at the gate of the evaluate device 150. Thus, for the embodiment shown in FIG. 1, an evaluate pulse arrives at the input to the domino logic 109 substantially concurrently with the termination of the reset pulse at the gate of the reset device 134. For other embodiments, the evaluate pulse may be separated from the reset pulse by a larger amount of time.

Due to the configuration of the reset circuitry in this example, the evaluate pulses at each of the inputs to domino logic stages 106–109 are five inversions wide. The three inversion-wide reset pulse and five inversion-wide evaluate pulse therefore correspond well with the eight inversion-wide Ck signal cycle of this example. It will be appreciated that, for other embodiments, different reset circuitry, pulsed clock signal characteristics, numbers of stages preceding the reset first latching mechanism, etc. may be used such that different clock cycle times and reset and evaluate pulse widths apply.

The state of the domino node 129 in response to the evaluate pulse is captured by the latching element 132 and recycled such that it is available to the static logic stage 114 and/or other subsequent circuitry until the end of the pulsed clock cycle. Thus, where the domino logic 109 evaluates low, the latching element 132 sustains the low value indicated at the domino node 129 until the domino node 129 is precharged in response to receiving the next reset pulse at the input to the precharge device 134.

Figure 7:
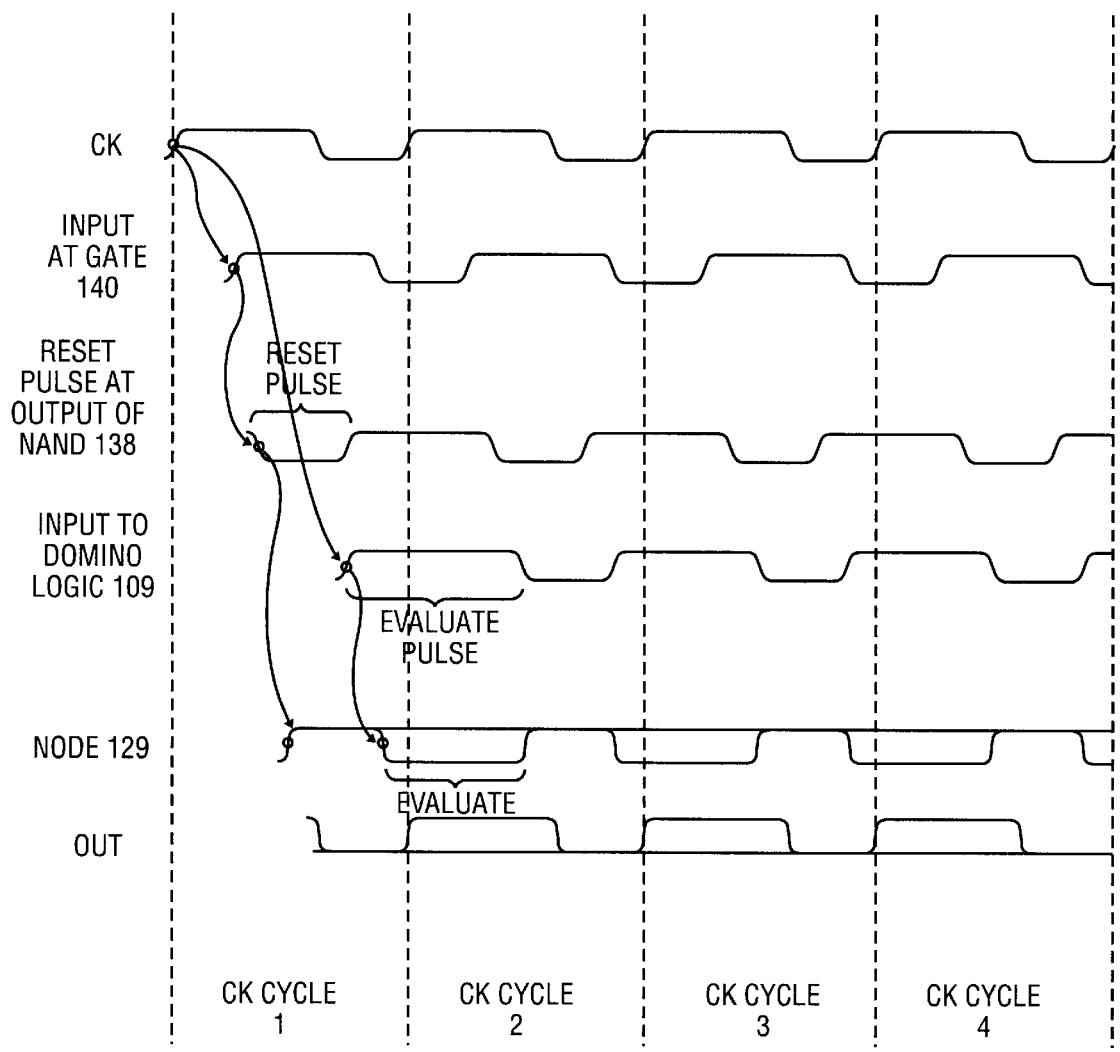
FIG. 7 is a timing diagram illustrating the relative timing of signals for the reset first latching mechanism of FIG. 1.

In the above-described manner, the reset first latching mechanism 105 first performs a pulsed reset which is then quickly followed by a conditional pulsed evaluate as shown in FIG. 7.

For another embodiment, as shown in FIG. 2, to provide additional minimum-delay (i.e. hold high and/or hold low) race protection and to protect against power race contention, an n-channel interrupt device 201 is coupled to the domino stack 209 of a reset first latching mechanism 205. The interrupt device 201 has a gate coupled to receive a reset input signal from a NAND gate 238 in a pulse chopper circuit 236. In this manner, for cases where inputs to the domino stage 209 could arrive early due to, for example, pattern dependence variations in the preceding datapath stages, the interrupt device 201 blocks an early evaluation of the domino stage 209 and contention with the reset device 234. Using the interrupt device 201, the domino stage 209 can only evaluate once the reset input pulse goes high to disable the reset pulse. The blocking provided by the interrupt device 201 may improve a minimum-delay race condition at the output of the reset first latching mechanism where the reset first latching mechanism is used to interface with subsequent circuitry (not shown).

FIG. 3 is a schematic diagram of a reset first latching mechanism 305 of another embodiment. Similar to the embodiment shown in FIG. 1, the reset first latching mechanism 305 includes a domino logic stage 309, a static logic stage 314, a latching element 332, a precharge device 334 and a pulse chopper circuit 336. It will be appreciated that the variations of each of these elements mentioned above in reference to FIG. 1 that may be used for various embodiments may also be used for various embodiments in the exemplary circuit of FIG. 3.

As shown in FIG. 3, the pulse chopper circuit 336 is implemented in a different manner than the pulse chopper circuit 136 of FIG. 1. The pulse chopper circuit 336 includes a NAND gate 338, a NOR gate 340 and three inverters 344–346. For one embodiment, the NAND gate 338 has one weak pull-up up device (indicated by the arrow at the input 347) coupled to receive an input signal from global reset circuitry 315. The size of the weak pull-up device is selected such that, in the time period of interest, the input signal to the NAND gate 338 that is received from the global reset circuitry 315 cannot by itself cause the output of the NAND gate 338 to transition from a low to a high logic level. In other words, in the time period of interest, a transition of the signal from the global reset circuitry 315 cannot by itself terminate a reset pulse. For other embodiments, a conventional NAND gate may instead be used.

The other input to the NAND gate 338 is coupled to an output of the NOR gate 340. The NOR gate 340 has one input coupled to an output of the inverter 344 and another input coupled to an output of the series coupled inverters 345 and 346. The input of the inverter 345 is coupled to the output of the inverter 344 and the input of the inverter 344 is coupled to receive a reset input signal from an output of the NAND gate 338.

In operation, when the Ck signal is low, the input 347 to the NAND gate 338 is low such that the output of the NAND gate 338 is high and the precharge device 334 is not enabled. The high output of the NAND gate 338 causes both inputs of the NOR gate 340 to transition to a logic low level three inversions later such that the output of the NOR gate 340 is at a logic high level. Thus, the input to the NAND gate 338 that is coupled to the output of the NOR gate 340 is also at a logic high level. In this manner, the pulse chopper circuit 336 is armed for the next cycle of the pulsed clock signal Ck.

A rising edge of the pulsed clock signal Ck received at a pull-down device 362 in the global reset circuitry 315 causes the input 347 of the NAND gate 338 to transition to a logic high level two inversions later. Because the other input to the NAND gate 338 is already at a logic high level, the NAND gate 338 output transitions to a logic low level enabling the precharge device 334 and initiating a reset pulse at the input to the precharge device 334. Thus, as in the exemplary embodiment of FIG. 1, a reset pulse is initiated approximately three inversions after the rising edge of the Ck signal is received at the gate of the pull-down device 362. The domino node 329 is then precharged in response to the reset pulse. The latching element 332 also operates in a similar manner to the latching element 132 of FIG. 1 to latch and sustain the logic level indicated at the domino node 329 even after input pulses to the domino stage are removed.

The low output of the NAND gate 338 causes a first input to the NOR gate 340 that is coupled directly to the output of the inverter 344 to transition to a logic high level one inversion later. The output of the NOR gate 340 then transitions to a logic low level causing the output of the NAND gate 338 to transition to a logic high level to disable the precharge device 334. Thus, the reset pulse at the gate of the precharge device 334 is chopped to have a pulse width equal to approximately three inversions as for the embodiment of FIG. 1.

The logic high output of the NAND gate 338 also causes the second input to the NOR gate 340 to transition to a logic low level. When both inputs to the NOR gate are at a logic low level (three inversions after the output of the NAND gate 338 transitions to a logic high level), the output of the NOR gate 340 transitions to a logic high level. The input of the NAND gate 338 is therefore also at a logic high level such that the pulse chopper circuit 336 is rearmed for the next Ck signal cycle eight inversions after the input clock signal to the reset first latching mechanism 305 (from the output of an inverter 360 in this example) rises.

By using the edge shifter-like configuration of the NOR gate 340 and the inverters 344–346, rearming of the NAND gate 338 can be delayed until after the Ck signal pulse at the input 347 to the NAND gate has ended. (The Ck signal pulse width is assumed for purposes of this example to be approximately five inversions wide). In this manner, a glitch on the reset pulse may be avoided while still rearming the NAND gate 338 in plenty of time for the next clock cycle.

It will be appreciated that, for other embodiments, different signal pulse widths may be used and the pulse chopper circuit may be configured in a different manner to correspond to the desired pulse width(s).

The evaluate pulse of the embodiment of FIG. 3 is similar in timing with respect to the reset pulse to the embodiment of FIG. 1 and thus, is not discussed in detail for this embodiment.

As in the embodiments of FIGS. 1 and 2, for the embodiment of FIG. 3, a reset of the domino stage is performed first and then quickly followed by a conditional evaluate.

The reset first latching mechanism of various embodiments accomplishes latching with fewer race conditions as compared to other approaches to latching that may be used in a pulsed environment. The number of race conditions is reduced because, starting from the domino node, the data nodes are not pulsed. Further, protection may be provided against some race conditions (e.g. hold high and hold low) that have the potential to be problematic when interfacing with subsequent circuitry. Additionally, the reset first latching mechanism provides a convenient interface between pulsed and static circuitry while enabling high speed operation. The static output signal from the reset first latching mechanism 205 can be used to drive longer distances than a corresponding pulsed output signal. Also, because the reset first latching mechanism is reset first and then quickly followed by an evaluate, the reset first latching mechanism of various embodiments may be less subject to domino soft errors.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   a pulse chopper circuit responsive to a pulsed signal to control initiation and termination of a reset pulse, a domino node to be precharged in response to the reset pulse;
   a domino logic circuit responsive to an evaluate pulse at an input to evaluate at the domino node based on a logic function performed by the domino logic circuit, the reset pulse being timed such that the reset pulse is completed before the evaluate at the domino node occurs, timing of the reset pulse to be independent of a state of an output of the domino logic circuit.

2. The apparatus of claim 1 further comprising:
   a latching element coupled to the domino node, the latching element to provide a static data signal corresponding to data indicated at the domino node.

3. The apparatus of claim 2 wherein the latching element comprises a jam latch.

4. The apparatus of claim 2 wherein the latching element comprises an interrupted keeper.

5. The apparatus of claim 1 further comprising:
an interrupt device coupled to the pulse chopper circuit and to the domino logic circuit, the interrupt device to block the evaluate pulse at the input until a reset pulse at the domino node has completed.

6. The apparatus of claim 1 wherein the pulsed signal is derived from a pulsed clock signal.

7. The apparatus of claim 6 wherein the pulsed clock signal has a frequency that is a multiple of a frequency of a non-pulsed clock signal that is used to clock other circuitry on an integrated circuit device that includes the apparatus.

8. The apparatus of claim 6 wherein the evaluate pulse is responsive to the pulsed clock signal.

9. The apparatus of claim 8 wherein the evaluate pulse is received by the domino logic circuit via one or more preceding logic stages.

10. The apparatus of claim 1 wherein an output of the pulse chopper circuit is coupled to a gate of a reset device, the reset device being responsive to the reset pulse from the pulse reducer circuit to initiate and terminate the reset pulse.

11. A circuit comprising:
a pulse chopper circuit responsive to a pulsed input signal to provide a reset pulse;
a precharge device responsive to the reset pulse to precharge a domino node at an output of a domino logic stage, the reset pulse being timed by the pulse chopper circuit such that the domino node is precharged before the domino logic stage is evaluated, timing of the reset pulse by the pulse chopper circuit to be independent of a state of the output of the domino logic stage; and
a latching element to provide a static output signal corresponding to data indicated at the domino node.

12. The circuit of claim 11 further comprising an interrupt device being coupled between the precharge device and the domino logic stage, the interrupt device to prevent the domino logic stage from evaluating before the reset pulse is terminated.

13. The circuit of claim 11 wherein the latching element comprises a jam latch.

14. The circuit of claim 11 wherein the pulse chopper is to generate the reset pulse and be rearmed for a next cycle of the pulsed input signal within a cycle time of the pulsed input signal.

15. The circuit of claim 14 wherein the reset pulse has a pulse width equivalent to approximately three unit delays and an evaluate pulse in response to which the domino logic stage is evaluated has a pulse width of approximately five unit delays.

16. The circuit of claim 14 wherein the pulse chopper is further to terminate the reset pulse substantially concurrently with the domino logic stage receiving an evaluate pulse, the domino logic stage to evaluate in response to the evaluate pulse.

17. The circuit of claim 11 wherein data nodes from the domino node to an output of the circuit are non-pulsed data nodes.

18. A method comprising:
receiving a pulsed input signal;
initiating a reset pulse in response to the pulsed input signal, a domino node at an output of a domino logic stage to be precharged in response to the reset pulse;
terminating the reset pulse such that the domino node is precharged before the domino logic stage evaluates, terminating the result pulse to include chopping the reset pulse to be narrower than a pulse of the pulsed input signal that initiated the reset pulse, wherein initiating and terminating are independent of a state of the domino node; and
providing a static output signal corresponding to data indicated at the domino node.

19. The method of claim 18 further comprising:
receiving an evaluate pulse at an input to the domino logic stage substantially concurrently with terminating the reset pulse.

20. The method of claim 19 further comprising:
preventing the domino logic stage from evaluating until the reset pulse has terminated.

21. The method of claim 18 wherein providing the static output signal comprises latching data indicated at the domino node.

22. The method of claim 21 wherein terminating the reset pulse comprises chopping the reset pulse such that the reset pulse has a pulse width that is narrower than a pulse width of the pulsed input signal.

* * * * *

UNITED STATES PATENT AND TRADEMARK OFFICE
CERTIFICATE OF CORRECTION

PATENT NO. : 6,542,006 B1
DATED : April 1, 2003
INVENTOR(S) : Sprague et al.

It is certified that error appears in the above-identified patent and that said Letters Patent is hereby corrected as shown below:

<u>Column 3,</u>
Line 26, delete "operatores", insert -- operates --.
Line 27, delete "intitate a rest", insert -- initiate a reset --.

Signed and Sealed this

Fifteenth Day of July, 2003

JAMES E. ROGAN
*Director of the United States Patent and Trademark Office*